(12) United States Patent
Chen et al.

(10) Patent No.: US 10,811,636 B2
(45) Date of Patent: Oct. 20, 2020

(54) LIGHT EMITTING DEVICE MANUFACTURING METHOD AND APPARATUS THEREOF

(71) Applicant: INT TECH CO., LTD., Hsinchu County (TW)

(72) Inventors: Yu-Hung Chen, Taoyuan (TW); Meng-Hung Hsin, New Taipei (TW); Cheng-Hsin Chen, Hsinchu County (TW)

(73) Assignee: INT TECH CO., LTD., Hsinchu County (TW)

( * ) Notice: Subject to any disclaimer, the term of this patent is extended or adjusted under 35 U.S.C. 154(b) by 0 days.

(21) Appl. No.: 15/695,853

(22) Filed: Sep. 5, 2017

(65) Prior Publication Data

US 2018/0130977 A1    May 10, 2018

Related U.S. Application Data

(60) Provisional application No. 62/420,089, filed on Nov. 10, 2016.

(51) Int. Cl.
*H01L 51/50*     (2006.01)
*H01L 51/52*     (2006.01)
(Continued)

(52) U.S. Cl.
CPC ...... *H01L 51/5262* (2013.01); *H01L 27/3211* (2013.01); *H01L 51/0026* (2013.01);
(Continued)

(58) Field of Classification Search
CPC ............ H01L 51/5262; H01L 51/0097; H01L 51/524; H01L 51/5096; H01L 51/5088; H01L 51/5253; H01L 27/3246
See application file for complete search history.

(56) References Cited

U.S. PATENT DOCUMENTS 6,905,784 B2 *    6/2005    Seo ..................... H01L 51/0035
                                                        257/100
9,088,011 B2      7/2015    Kim et al.
(Continued)

FOREIGN PATENT DOCUMENTS

CN          104681580 A       6/2015
CN          104685653 A       6/2015
(Continued)

OTHER PUBLICATIONS

Office Action and Search Report dated Jun. 17, 2019 by the Taiwan Patent Office for counterpart Taiwan application No. 107128834.
(Continued)

*Primary Examiner* — Joseph L Williams
*Assistant Examiner* — Jose M Diaz
(74) *Attorney, Agent, or Firm* — WPAT, P.C., Intellectual Property Attorneys; Anthony King

(57) ABSTRACT

A light emitting device includes a first type carrier transportation layer and an organic light emitting unit over the first type carrier transportation layer. The light emitting device further includes a second type carrier transportation layer over the organic light emitting unit, wherein the second type is opposite to the first type. At least one of the first type carrier transportation layer and the second type carrier transportation layer includes a metal element.

20 Claims, 21 Drawing Sheets

(51) Int. Cl.
   *H01L 51/56* (2006.01)
   *H01L 27/32* (2006.01)
   *H01L 51/00* (2006.01)

(52) U.S. Cl.
   CPC ........ *H01L 51/506* (2013.01); *H01L 51/5012* (2013.01); *H01L 51/5076* (2013.01); *H01L 51/5088* (2013.01); *H01L 51/5096* (2013.01); *H01L 51/524* (2013.01); *H01L 51/56* (2013.01); *H01L 27/3246* (2013.01); *H01L 51/0097* (2013.01); *H01L 51/5253* (2013.01)

(56) References Cited

U.S. PATENT DOCUMENTS

| | | | |
|---|---|---|---|
| 9,711,746 | B2 | 7/2017 | Lee et al. |
| 9,768,404 | B1* | 9/2017 | Steckel ............... H01L 51/502 |
| 9,887,250 | B2* | 2/2018 | Matsusue ............ H01L 27/3246 |
| 2002/0028349 | A1 | 3/2002 | Seo |
| 2004/0056266 | A1 | 3/2004 | Suh et al. |
| 2008/0257473 | A1 | 10/2008 | Tremel et al. |
| 2009/0087792 | A1 | 4/2009 | Iizumi et al. |
| 2012/0315714 | A1* | 12/2012 | Shanks ............. C09K 19/2028 438/29 |
| 2013/0109117 | A1 | 5/2013 | Lee et al. |
| 2014/0120645 | A1 | 5/2014 | Paek et al. |
| 2014/0135530 | A1* | 5/2014 | Zhang ................ C07F 9/5045 568/15 |
| 2015/0069357 | A1 | 3/2015 | Park |
| 2015/0102310 | A1* | 4/2015 | Diez ................. H01L 51/5278 257/40 |
| 2015/0295203 | A1 | 10/2015 | Yamazaki et al. |
| 2016/0293675 | A1 | 10/2016 | Kim |
| 2016/0343940 | A1 | 11/2016 | Kong et al. |
| 2016/0372527 | A1 | 12/2016 | Takashige et al. |
| 2017/0077188 | A1 | 3/2017 | Kang et al. |
| 2017/0125494 | A1* | 5/2017 | Matsusue ............ H01L 27/3246 |
| 2017/0125745 | A1 | 5/2017 | Lee et al. |
| 2017/0194396 | A1 | 7/2017 | Choe |
| 2018/0097045 | A1* | 4/2018 | Maeda ................ H01L 51/5253 |

FOREIGN PATENT DOCUMENTS

| | | | | |
|---|---|---|---|---|
| CN | 105590947 | A | | 5/2016 |
| EP | 1052708 | A2 | | 11/2000 |
| EP | 3128557 | A1 | | 2/2017 |
| JP | 2009087760 | A | | 4/2009 |
| JP | WO 2015141142 | A1 | * 9/2015 | ......... H01L 51/5044 |
| JP | 2017091946 | A | | 5/2017 |
| TW | 200635425 | A | | 10/2006 |
| TW | 201322442 | A | | 6/2013 |
| TW | I553930 | | | 10/2016 |
| TW | 201701463 | A | | 1/2017 |

OTHER PUBLICATIONS

English abstract translation of the Office Action and Search Report dated Jun. 17, 2019 by the Taiwan Patent Office for counterpart Taiwan application No. 107128834.
Office Action and Search Report dated Jun. 26, 2019 by the Taiwan Patent Office for counterpart Taiwan application No. 107131151.
English abstract translation of the Office Action and Search Report dated Jun. 26, 2019 by the Taiwan Patent Office for counterpart Taiwan application No. 107131151.
TW201322442 corresponds to US20130109117.
TW200635425 corresponds to US20080257473.
TW201701463 corresponds to US20150295203.
Search Report dated Jan. 22, 2019 by the European Patent Office for counterpart application No. 18192741.9.
Summary of European Search Report dated Jan. 22, 2019 by the European Patent Office for counterpart application No. 18192741.9.
Search Report dated Jan. 22, 2019 by the European Patent Office for counterpart application No. 18192725.2.
Summary of European Search Report dated Jan. 22, 2019 by the European Patent Office for counterpart application No. 18192725.2.
Office Action and Search Report dated Mar. 4, 2019 by the China National Intellectual Property Administration for counterpart application No. 201711090656.7.
English Abstract Translation of Search Report Issued by the China National Intellectual Property Administration.
U.S. Pat. No. 9,711,746 is a family patent to Foreign Patent Document CN105590947A.
U.S. Pat. No. 9,088,001 is a family patent to Foreign Patent Document CN104681580A.
Office Action and Search Report dated Sep. 10, 2018 issued by the Taiwan Intellectual Property Office (TIPO) for counterpart application No. 106138280.
English Abstract Translation of Office Action and Search Report dated Sep. 10, 2018 issued by the Taiwan Intellectual Property Office (TIPO) for counterpart application No. 106138280.
English Abstract Translation of CN104685653A.
English Abstract Translation of TWI553930.
Office Action from the China National Intellectual Property Administration of China patent application No. 201810993891.3 dated Apr. 23, 2020.
Search Report from the China National Intellectual Property Administration of China patent application No. 201810993891.3 dated Apr. 23, 2020.
Office Action from the Korean Intellectual Property Office of Korean patent application No. 10-2018-0100398 dated Oct. 7, 2019.

* cited by examiner

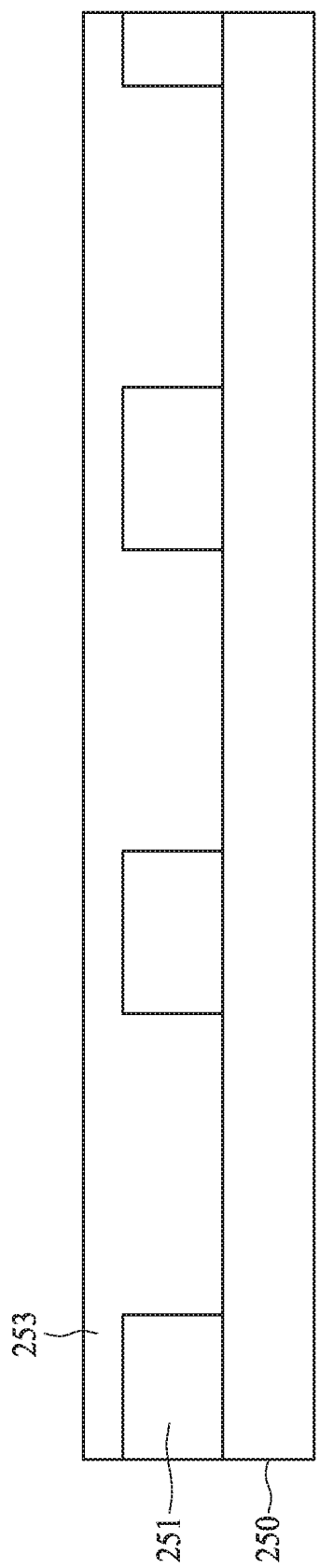

LIGHT EMITTING DEVICE MANUFACTURING METHOD AND APPARATUS THEREOF

CROSS-REFERENCE TO RELATED APPLICATIONS

The present application claims priority of U.S. Provisional Patent Application Ser. No. 62/420,089, filed on Nov. 10, 2016, which is incorporated herein by reference in its entirety.

TECHNICAL FIELD

The present disclosure is related to light emitting device, especially to an organic light emitting device and manufacturing method thereof.

BACKGROUND

Organic light emitting display (OLED) has been used widely in most high end electron devices. However, due to the constraint of current technology, the pixel definition is realized by coating a light emitting material on a substrate through a mask, and often, the critical dimension on the mask can not be smaller than 100 microns. Therefore, pixel density having 800 ppi or higher becomes a difficult task for an OLED maker.

SUMMARY

In the present disclosure, the light emitting units are formed by a photo sensitive material. The photo sensitive material is directly disposed on a substrate without through a mask. The pixel definition is realized by a photolithography process.

A light emitting device includes a first type carrier transportation layer and an organic light emitting unit over the first type carrier transportation layer. The light emitting device further includes a second type carrier transportation layer over the organic light emitting unit, wherein the second type is opposite to the first type. At least one of the first type carrier transportation layer and the second type carrier transportation layer includes a metal element.

In some embodiments, the metal element is a transition metal. The organic light emitting unit has a width being not greater than 2 um. The organic light emitting unit is photo sensitive. The organic light emitting unit includes a footing extended laterally from the bottom of the organic light emitting unit. The organic light emitting unit includes a tapered sidewall and the tapered sidewall includes at least two different slopes.

A light emitting device includes a substrate and an array of organic light emitting units over the substrate. The light emitting device further has a secondary light emitting unit adjacent to one of the organic light emitting units in the array, wherein the secondary light emitting unit includes a second height and the one of the organic light emitting units in the array includes a first height, the second height is smaller than the first height.

In some embodiments, the light emitting device further includes a first type carrier transportation layer under the array of organic light emitting units and the secondary light emitting unit. The organic light emitting units in the array has a gap with an aspect ratio, wherein the aspect ratio is correlated to a height ratio between the secondary light emitting unit and an organic light emitting unit adjacent to the secondary light emitting unit. The secondary light emitting unit is in a strip shape, or in a circular shape. In some embodiments, the secondary light emitting unit is in a quadrilateral shape.

In some embodiments, the light emitting device further includes a second type carrier transportation layer over the array of organic light emitting units. The first or second type carrier transportation layer is a composite structure.

A method of manufacturing a light emitting device includes providing a substrate; forming a first type carrier transportation layer over the substrate; forming a metallic layer on the first type carrier transportation layer, treating the surface of the metallic layer thereby driving a metallic element from the metallic layer into the first type carrier transportation layer; forming a photo sensitive organic light emitting layer over the first type carrier transportation layer; and patterning the photo sensitive organic light emitting layer to form a light emitting unit.

In some embodiments, the metallic layer includes a transition metal or treating the surface of the metallic layer includes one of heating, microwave, or plasma treatment. In some embodiments, the method further includes a first type carrier injection layer between the first type carrier transportation layer and the substrate.

DETAILED DESCRIPTION OF THE DISCLOSURE

The present disclosure provides a light emitting device, especially, organic light emitting device (OLED), and a method of manufacturing thereof. In the present disclosure, an organic light emitting layer in the OLED is formed by photo lithography. In some embodiments, the organic light emitting layer is a polymer light emitting layer. In some embodiments, the organic light emitting layer includes several light emitting pixels.

Figure 1:
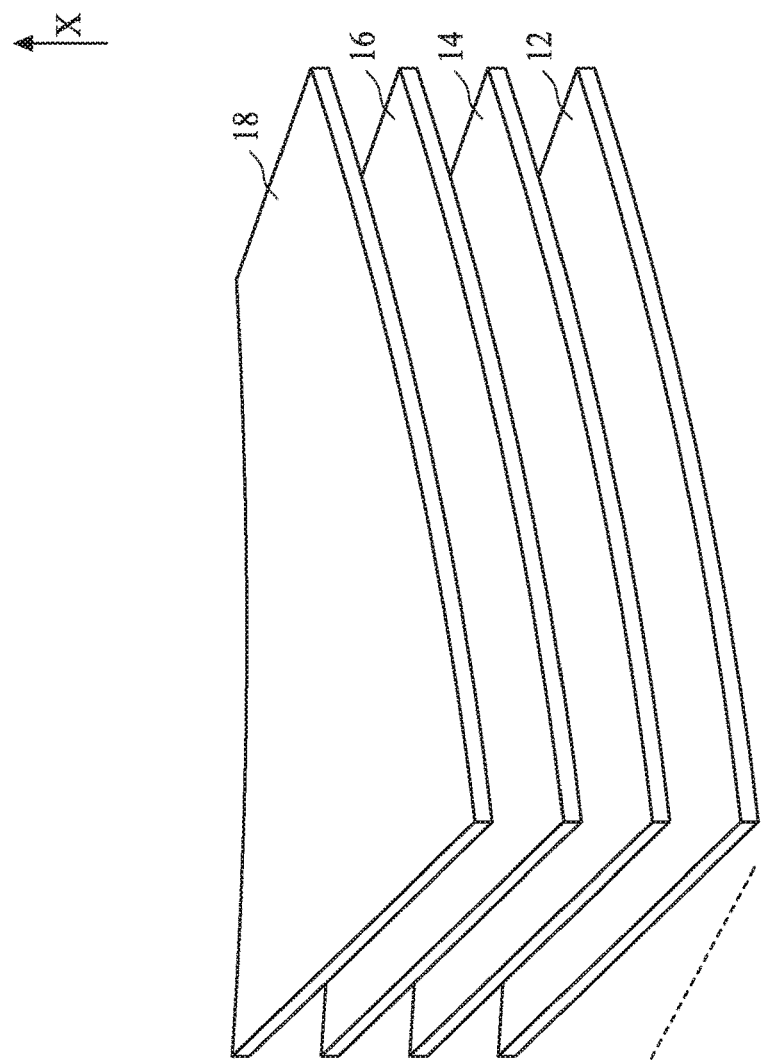
FIG. 1 is a flexible light emitting device.
Figure 1:
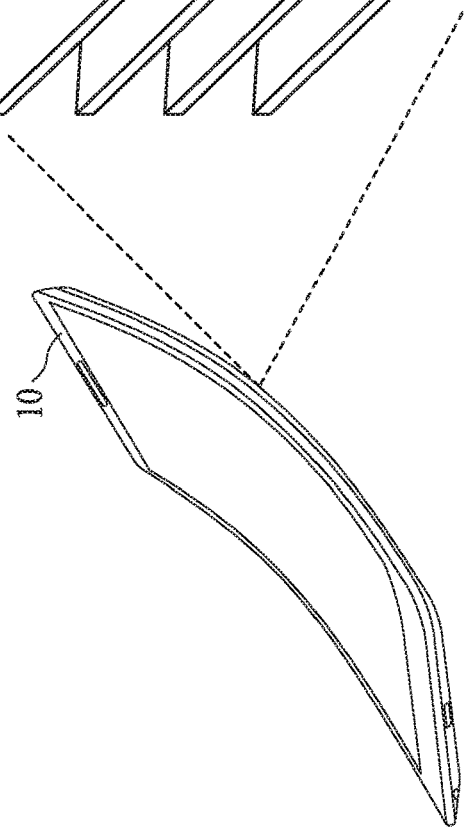

FIG. 1 illustrates an embodiment of an electronic device 10. The electronic device 10 can be a rigid or a flexible display. Display 10 can have at least four different layers substantially stacked along a thickness direction X. Layer 12 is a substrate configured as a platform to have a light emitting layer 14 disposed thereon. Layer 16 is a cap layer to be disposed on the light emitting layer 14 and layer 18 is configured as a window for light emitting in/out the electronic device 10. In some embodiments, layer 16 is an encapsulation layer. Layer 18 can also be configured as a touch interface for the user, therefore the surface hardness of the might be high enough to meet the design requirement. In some embodiments, layer 16 and layer 18 are integrated into one layer.

Layer 12 might be formed with a polymer matrix material. Layer 12 has a bend radius being not greater than about 3 mm. In some embodiments, layer 12 has a minimum bend radius being not greater than 10 mm. The minimum bend radius is measured to the inside curvature, is the minimum radius one can bend layer 12 without kinking it, damaging it, or shortening its life. In some embodiments, several conductive traces may be disposed in layer 12 and form circuitry to provide current to the light emitting layer 14. In some embodiments, layer 12 includes graphene.

Figure 2:
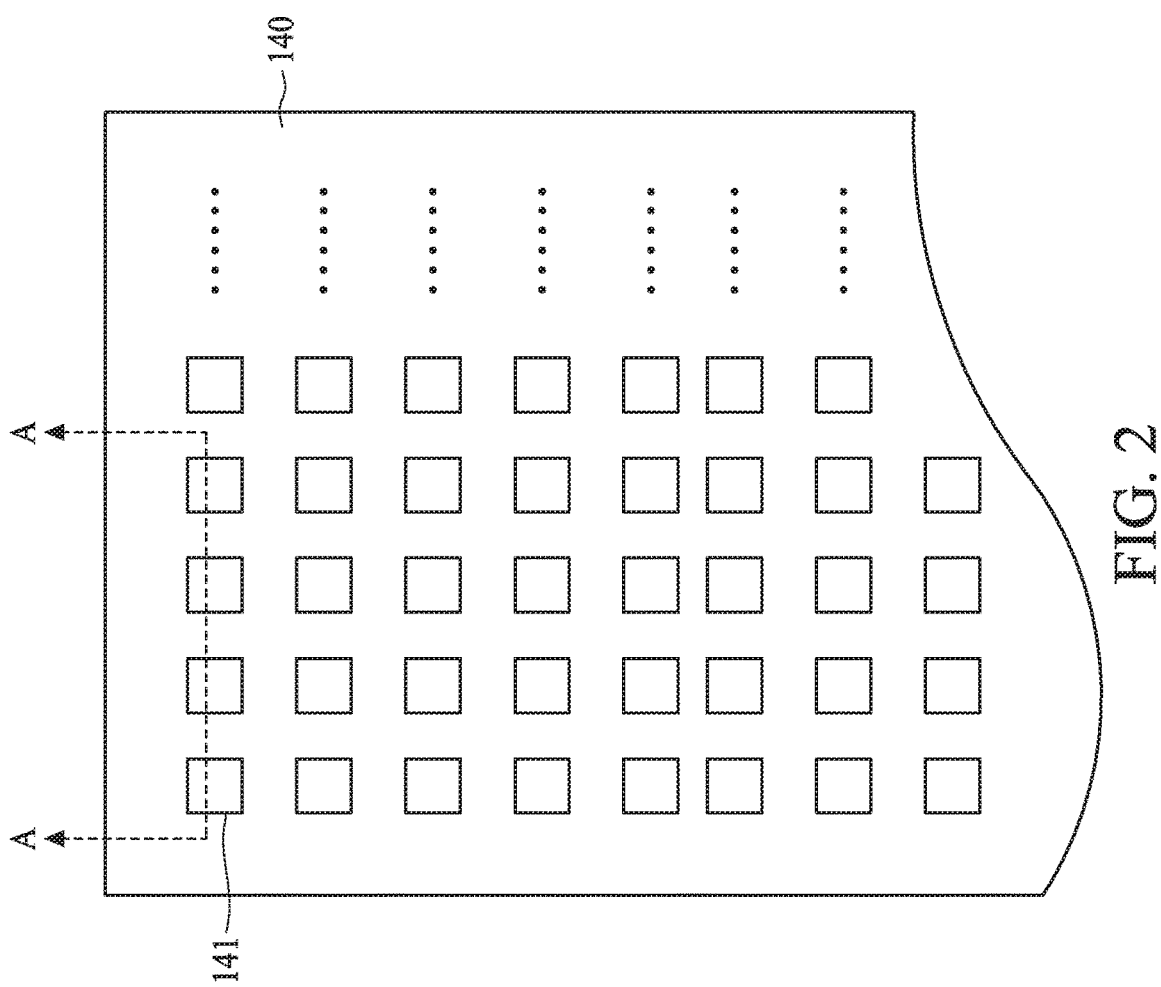
FIG. 2 is top view of a portion of a flexible light emitting device according to an embodiment.
Figure 3:
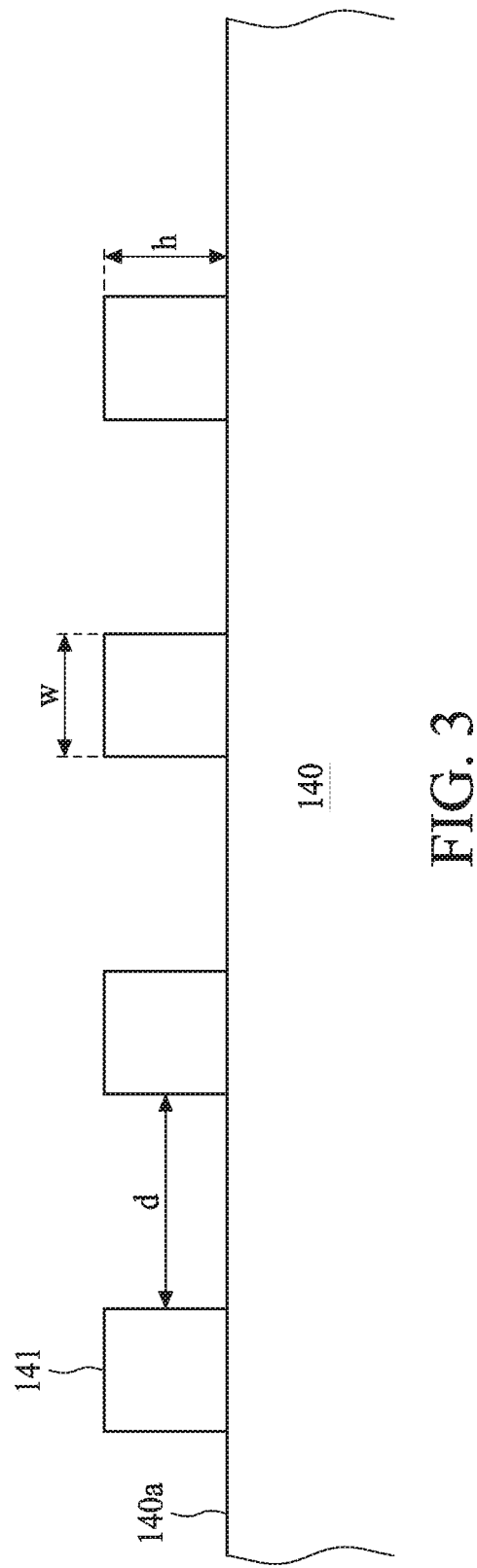
FIG. 3 is cross sectional view of a portion of a flexible light emitting device according to an embodiment.

Light emitting layer 14, can be configured as an array, as shown in FIG. 2, including many light emitting units. A cross sectional view of along ling AA is illustrated in FIG. 3. In some embodiments, the layer 14 has a substrate 140. In some embodiments, the substrate is configured to be able to provide current to the light emitting units. In some embodiments, the light emitting units 141 are configured as mesa disposed on the substrate 140. In some embodiments, the light emitting units are configured to be in recesses of the substrate 140. A thickness "h" of the light emitting units may range from about −100 um to about 100 um. The thickness h is measured from the surface 140a of the substrate 140. The negative value means the light emitting unit is disposed in the recess. Positive means light emitting unit protrudes like mesa shown in FIG. 3. The light emitting units can be arranged in an array. Each independent light emitting unit is separated from other adjacent light emitting units. A gap, d, represents a separation distance between two adjacent light emitting units. In some embodiments, gap, d, is between about 2 nm and about 100 um. In some embodiments, the gap, d, is controlled to be at least not greater than about 50 um so that the density of the units can be designed to be at least more than 700 ppi or 1200 ppi.

In some embodiments, a light emitting unit has a width, w, being between about 2 nm and about 500 um. The light emitting unit is a polymeric material. In some embodiments, the light emitting unit is photo sensitive. In some embodiments the width, w, is not greater than about 2 um.

Figure 4:
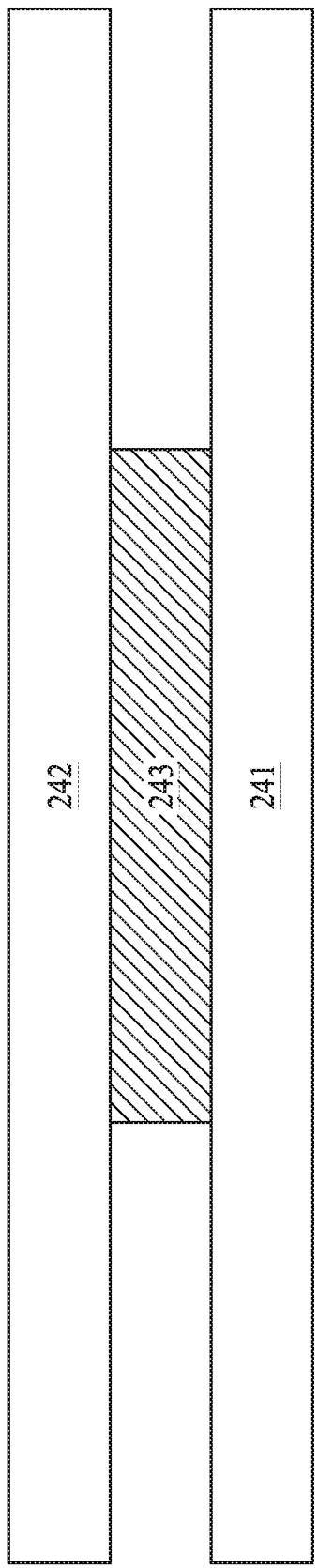
FIG. 4 is cross sectional view of a portion of a flexible light emitting device according to an embodiment.

FIG. 4 illustrates an embodiment of a light emitting pixel 24 in a light emitting layer from a crossectional view perspective. The light emitting pixel 24 includes a light emitting unit 243 as the light emitting unit in FIG. 3. Further, the light emitting pixel 24 includes a first type carrier transportation layer 241 and a second type carrier transportation layer 242. The first type is opposite to the second type. In some embodiments, the first type transportation layer 241 is a hole transportation layer (HTL) and the second type carrier transportation layer 242 is an electron transportation layer (ETL). In some embodiments, the first type transportation layer 241 is an electron transportation layer (ETL) and the second type carrier transportation layer 242 is a hole transportation layer (HTL).

In some embodiments, trace of metal is found in the first type carrier transportation layer 241 or the second type carrier transportation layer 242. Moreover, metal element may appear first type carrier transportation layer 241 or the second type carrier transportation layer 242. The metal element includes transition metal. In some embodiments, the metal element includes at one of the elements, Y, Zr, Nb, Mo, Ru, Rh, Cd, Hf, Ta, W, Re, Os.

In some embodiments, the light emitting unit 243 is in contact with the first type transportation layer 241. In some embodiments, the light emitting unit 243 is in contact with the second type transportation layer 242. In some embodiments, an intermediate layer is between the light emitting unit 243 and the first type transportation layer 241. In some embodiments, an intermediate layer is between the light emitting unit 243 and the second type transportation layer 242.

Figure 5:
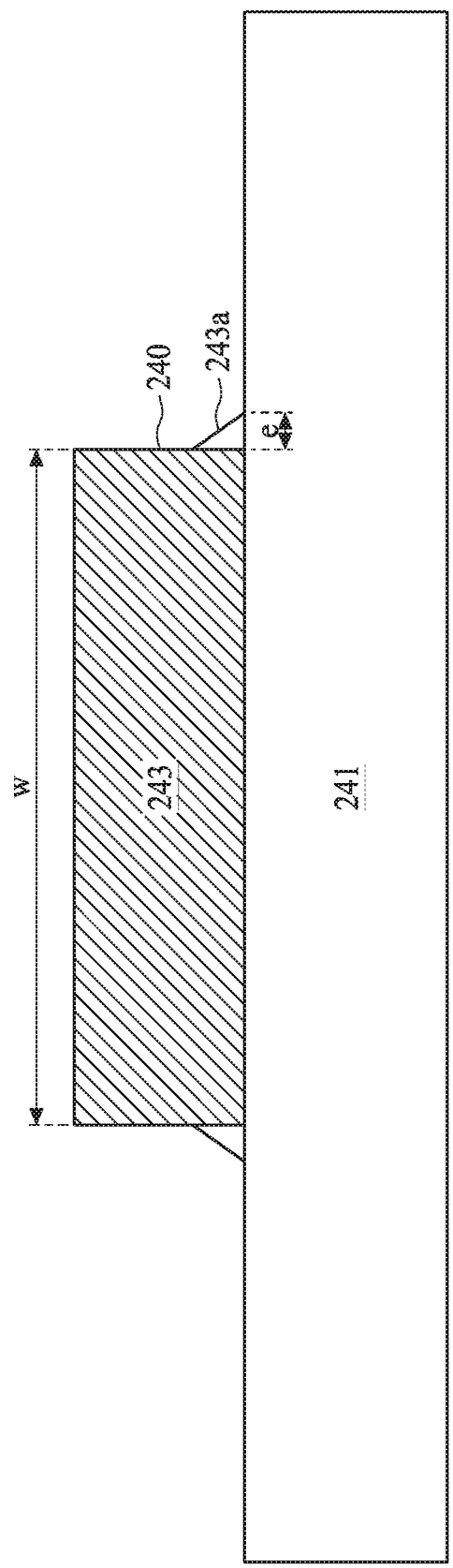
FIG. 5 is cross sectional view of a portion of a flexible light emitting device according to an embodiment.

FIG. 5 is an enlarged view of the light emitting unit 243 in FIG. 4 in according to some embodiments. The light emitting unit 243 has a footing 243a extended laterally from the sidewall 240 of the light emitting unit 243. The footing 243a is in contact with the first type transportation layer 241. The lateral extension of the footing 243a has a width, e, which is measured from the sidewall 240 to the tip of the footing 243a. The tip is farthest point where the footing 243a can extend. The tip is also the end point where the footing meets the first type transportation layer 241.

Figure 6:
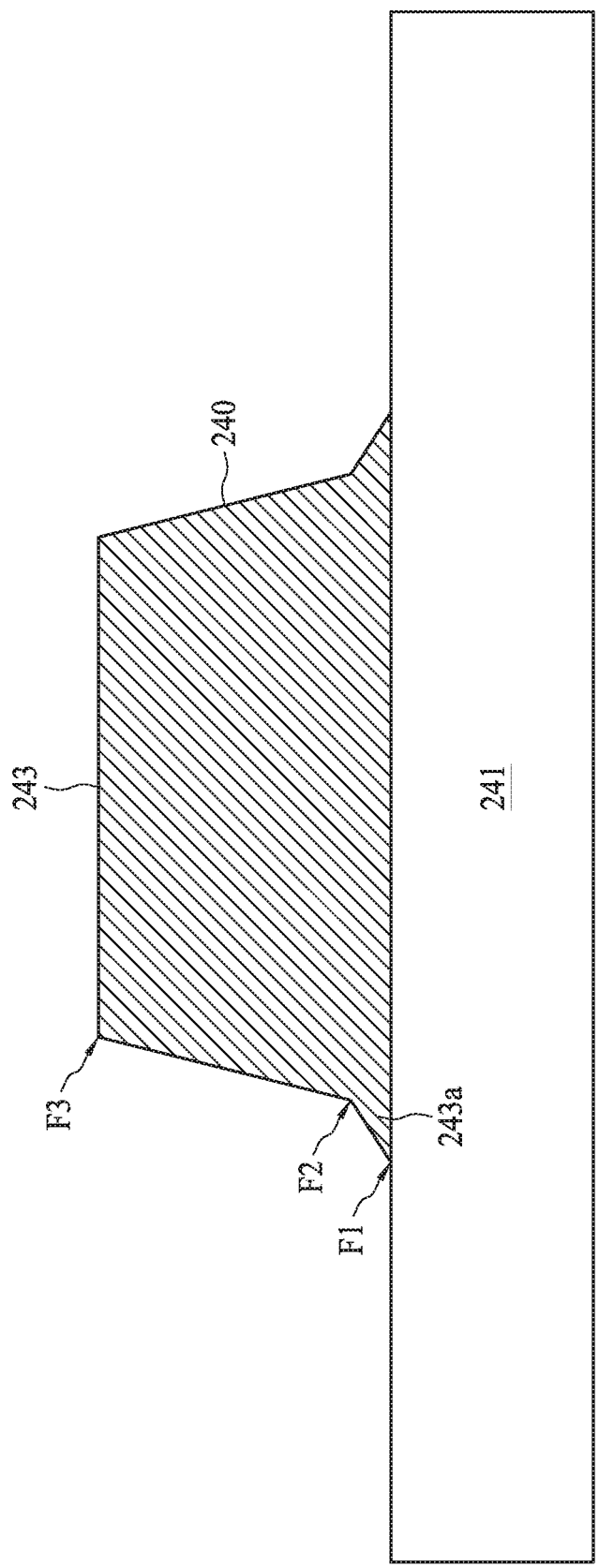
FIG. 6 is cross sectional view of a portion of a flexible light emitting device according to an embodiment.
Figure 7:
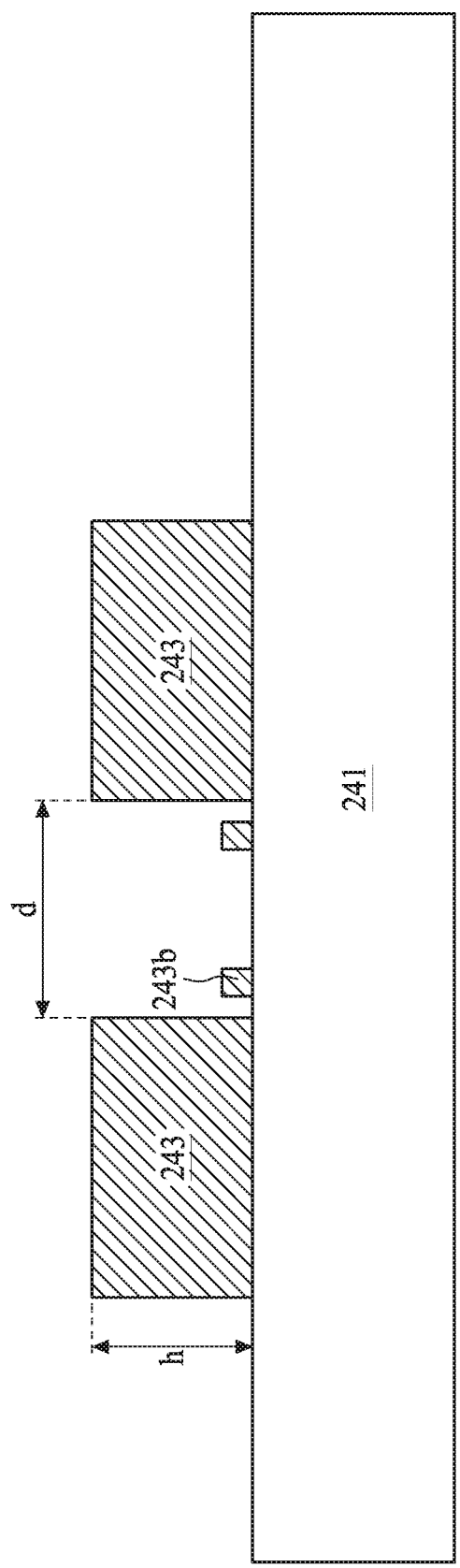
FIG. 7 is cross sectional view of a portion of a flexible light emitting device according to an embodiment.

FIG. 6 illustrates another embodiment of a light emitting unit 243 in FIG. 4. The sidewall 240 of the light emitting unit is tapered and has two different slopes. The first slope is measured from the tip F1 of the footing 243a to the turning point F2. The second slope is measured from the turning point F2 to the top corner F3 of the light emitting unit 243. In some embodiments, the second slope is greater than the first slope.

One of the purposes to have a footing 243a extended from the bottom of the light emitting unit 243 is to increase the adhesion between the light emitting unit 243 and the first type transportation layer 241. Because the light emitting unit 243 and the first type transportation layer 241 may be formed with different materials, the surface tension between the light emitting unit 243 and the first type transportation layer 241 may cause undesired peeling. With the footing 243a, the contact surface between the light emitting unit 243 and the first type transportation layer 241 is increased to secure the light emitting unit 243 sitting on the first type transportation layer 241.

In some embodiments, there are some secondary light emitting unit 243b disposed between two adjacent light emitting unit 243. The secondary light emitting unit 243b has a height that is smaller than the height, h, of the light emitting unit 243. The secondary light emitting unit 243b is isolated from the light emitting unit 243. In some embodiments, the height of the secondary light emitting unit 243b is about ⅕ to about 1/15 of the height of the light emitting unit 243.

In some embodiments, the light emitting unit 243 and an adjacent secondary light emitting unit 243b emit a light with a same wavelength. In some embodiments, some light emitting units are designed to emit a light with a first wavelength. Some light emitting units are designed to emit a light with a second wavelength, which is different from the first wavelength. Some light emitting units are designed to emit a light with a third wavelength, which is different from the first wavelength and the second wavelength. One light emitting unit may be assigned to have a secondary light emitting unit disposed adjacent to the light emitting unit and the assigned secondary light emitting unit emits a light with the same wavelength as the corresponding light emitting unit.

Figure 8:
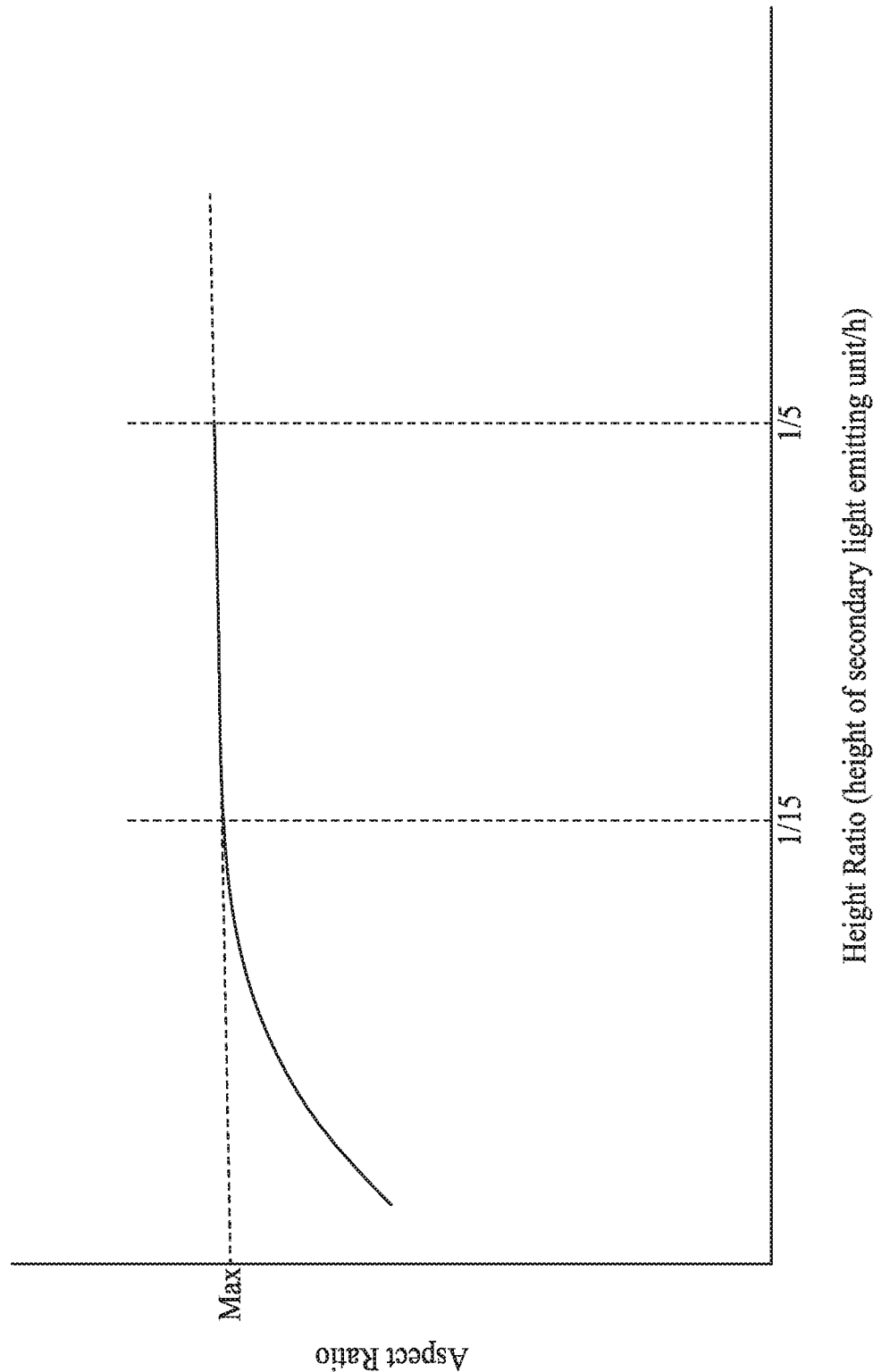
FIG. 8 illustrates a correlation between the aspect ratio and height ratio.

Aspect ratio of light emitting unit 243 is defined as the height h of the light emitting unit 243 divided by the gap, d, between two adjacent light emitting units. As shown in FIG. 8, when the height ratio between the secondary light emitting unit 243b and the light emitting unit 243 reaches 1/15, the aspect ratio start entering into a saturation zone until the height ratio reaches 1/5. For an ultra-high PPI (>1200 ppi) display, the designer can adjust the height ratio between the secondary light emitting unit 243b and the light emitting unit 243 in order to meet the requirement of the aspect ratio.

Figure 9:
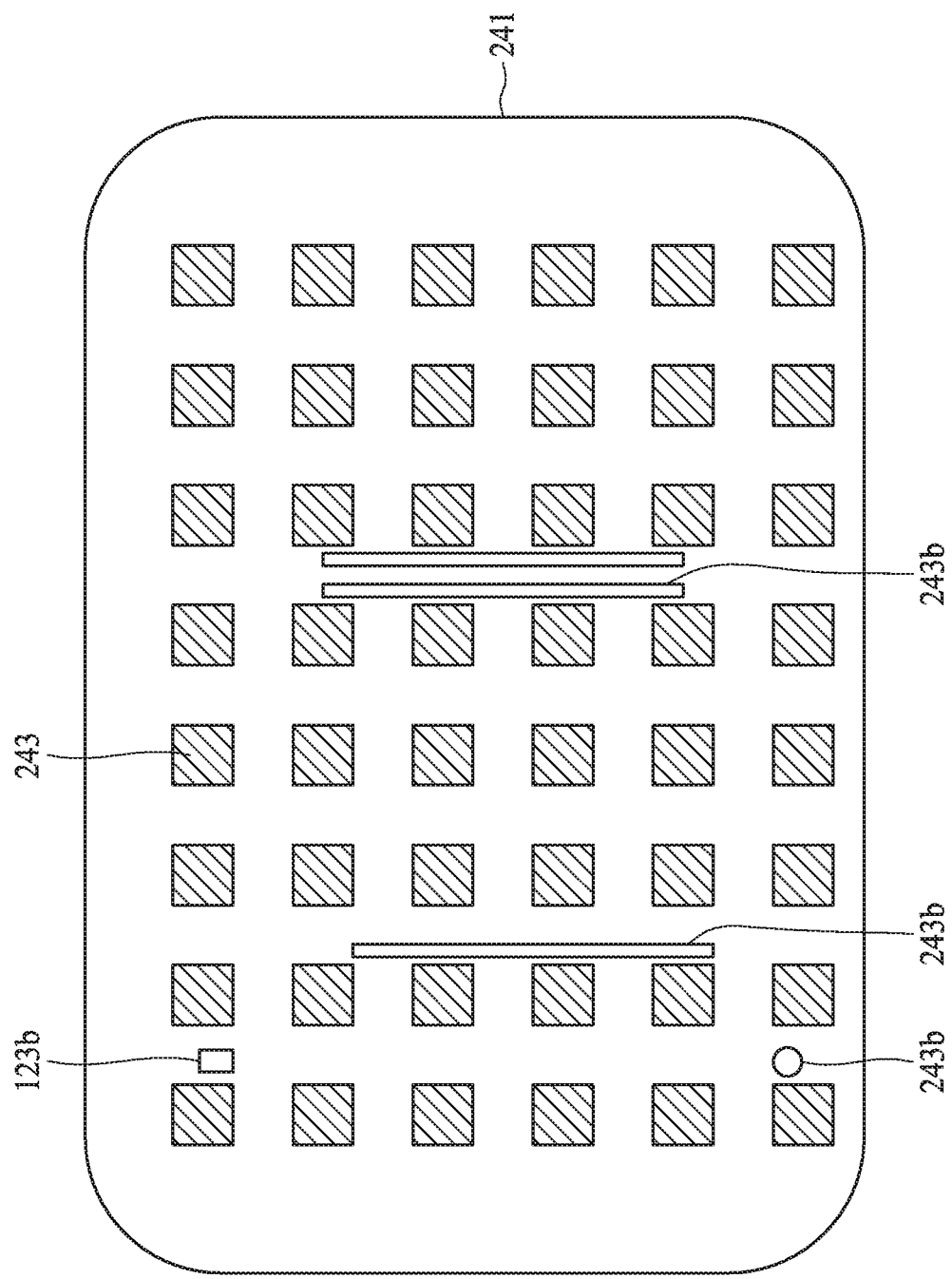
FIG. 9 is top view of a portion of a flexible light emitting device according to an embodiment.

FIG. 9 is a top view of an embodiment of an array of light emitting unit 243 disposed on a first type transportation layer 241. The secondary light emitting unit 243b can be formed as in quadrilateral, circle, or a strip shape.

In some embodiments, a secondary light emitting unit 243b is formed to be in corresponding to only one pair of light emitting units 243. The secondary light emitting unit 243b is designed to improve the aspect ratio of the gap between of the pair of light emitting units 243. In some embodiments, a circular shaped secondary light emitting unit 243b may increase the maximum aspect ratio (Max in FIG. 8) to be 10% to 15% higher than a quadrilateral one.

In some embodiments, a secondary light emitting unit 243b is formed to be in corresponding to several pairs of light emitting units 243. Like the one in a strip pattern at left side, the strip-like secondary light emitting unit 243b is designed to be corresponding to at least three different pairs of light emitting units 243.

In some embodiments, there are at least two separate secondary light emitting units 243b formed to be in corresponding to several pairs of light emitting units 243. As the two strip-like light emitting units 243b at the right side, there are two secondary light emitting strips in parallel.

Figure 10:
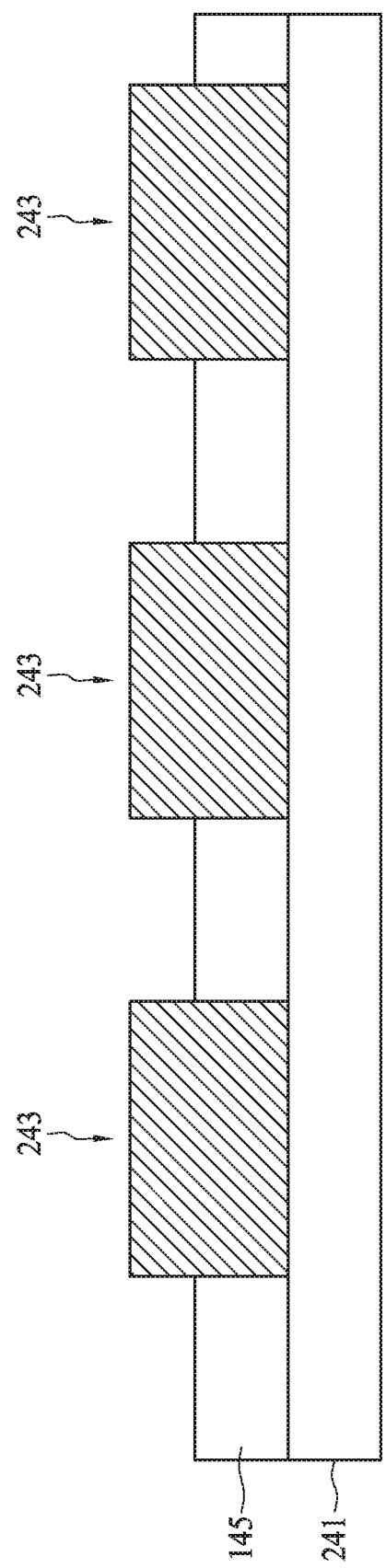
FIG. 10 cross sectional view of a portion of a flexible light emitting device according to an embodiment.

In order to minimize the interference between adjacent light emitting units 243, an absorption material 145 can be used to fill the gaps between light emitting units 243 as shown in FIG. 10. The absorption material 145 can absorb the light emitted from the light emitting units 243 and any visible light entering into the device from ambient.

Figure 11:
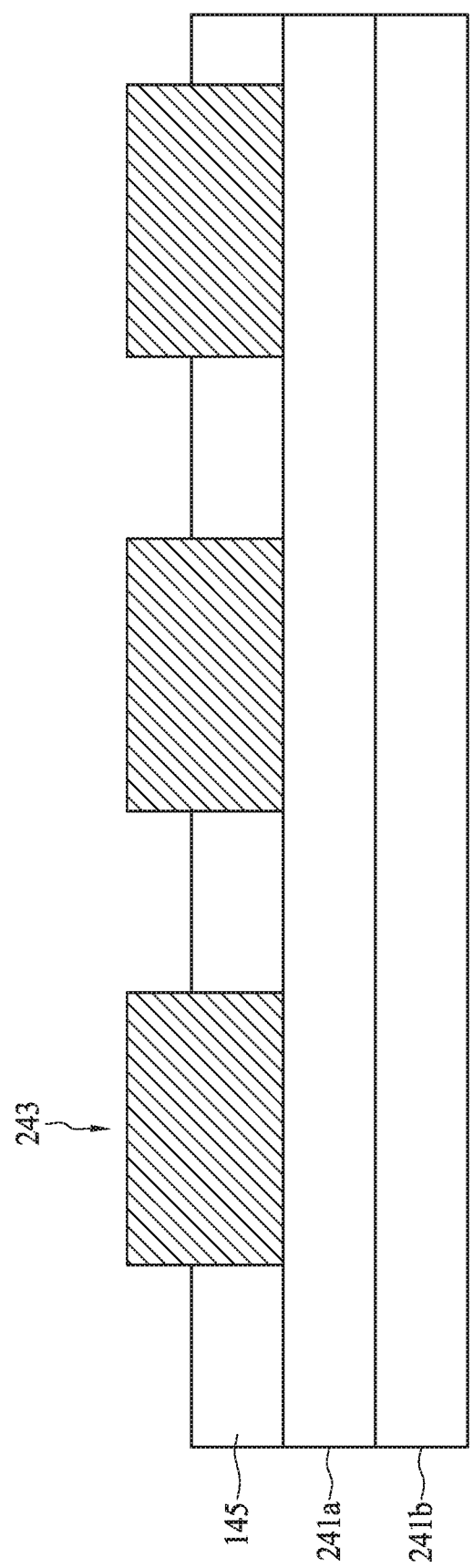
FIG. 11 is cross sectional view of a portion of a flexible light emitting device according to an embodiment.

In some embodiments, the first type carrier transportation layer 241 is a composite structure and includes at least a primary layer 241a and a secondary transportation layer 241b as in FIG. 11. The trace of metal is found in any one sub-layer of the first type carrier transportation layer 241. The metal element includes transition metal. In some embodiments, the metal element includes at one of the elements, Y, Zr, Nb, Mo, Ru, Rh, Cd, Hf, Ta, W, Re, Os.

Similarly, in some embodiments, the second type carrier transportation layer 242 is a composite structure and includes at least a primary layer and a secondary transportation layer. The trace of metal is found in any one sub-layer of the second type carrier transportation layer 242. The metal element includes transition metal. In some embodiments, the metal element includes at one of the elements, Y, Zr, Nb, Mo, Ru, Rh, Cd, Hf, Ta, W, Re, Os. In some embodiments, layer 606 or 306 may include Cs, Rb, K, Na, Li, Yb, Lu, Tm, etc.

Figure 12:
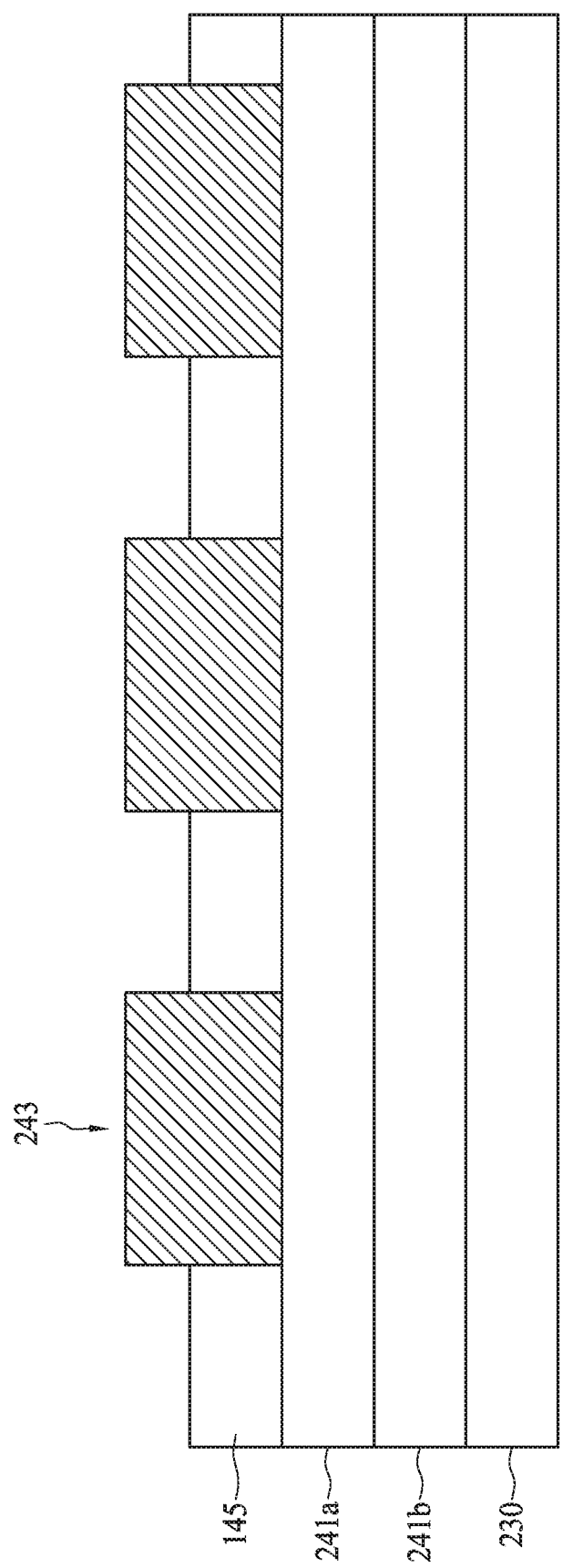
FIG. 12 is cross sectional view of a portion of a flexible light emitting device according to an embodiment.

In some embodiments, there is a first type carrier injection layer adjacent to the first type carrier transportation layer. As in FIG. 12, the first type carrier injection layer 230 is adjacent to the first type carrier transportation layer 241. Similarly, there is a second type carrier injection layer adjacent to the second type carrier transportation layer.

Figure 13A:
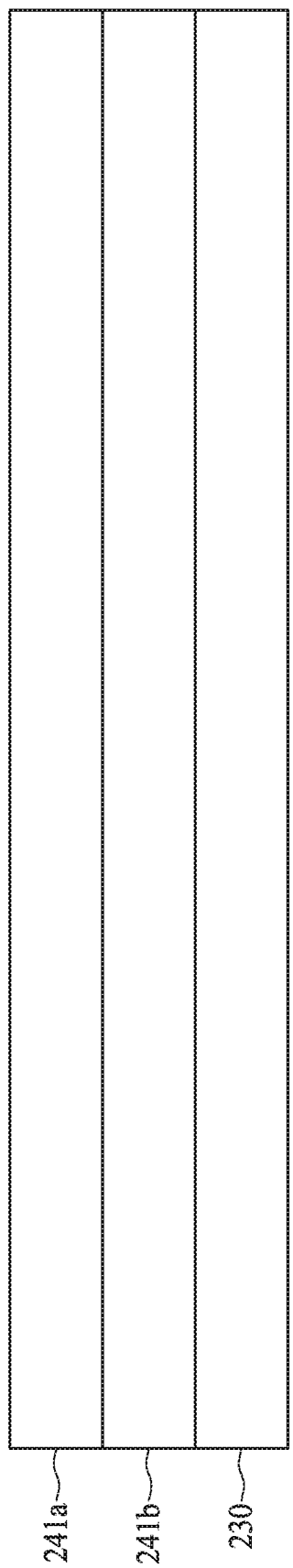
FIG. 13A-14D illustrate operations of manufacturing a flexible light emitting device according to an embodiment.
Figure 13B:
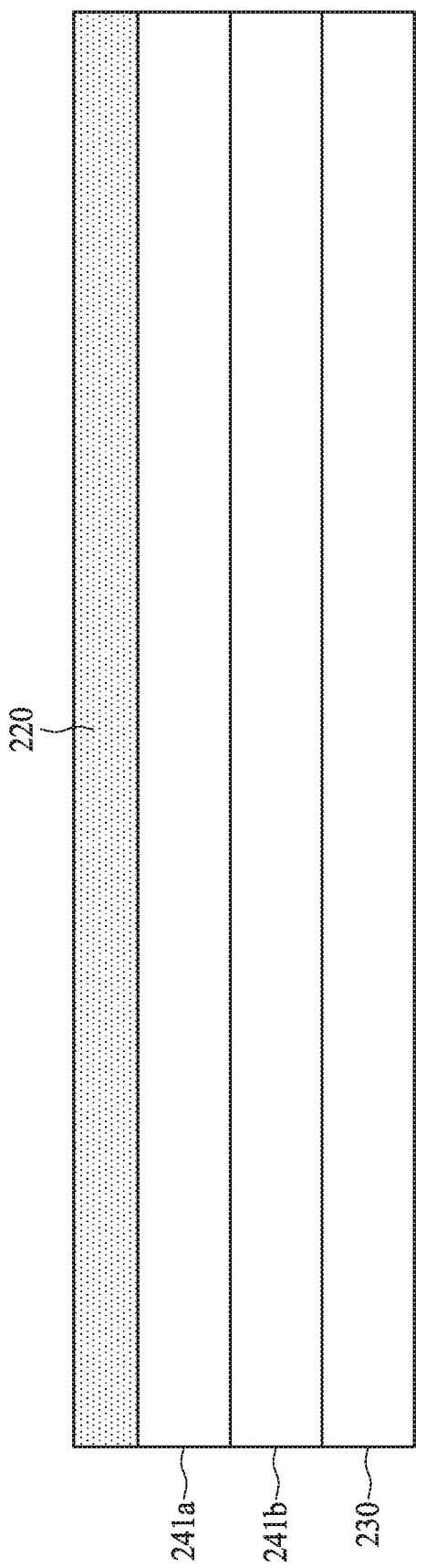
Figure 13C:
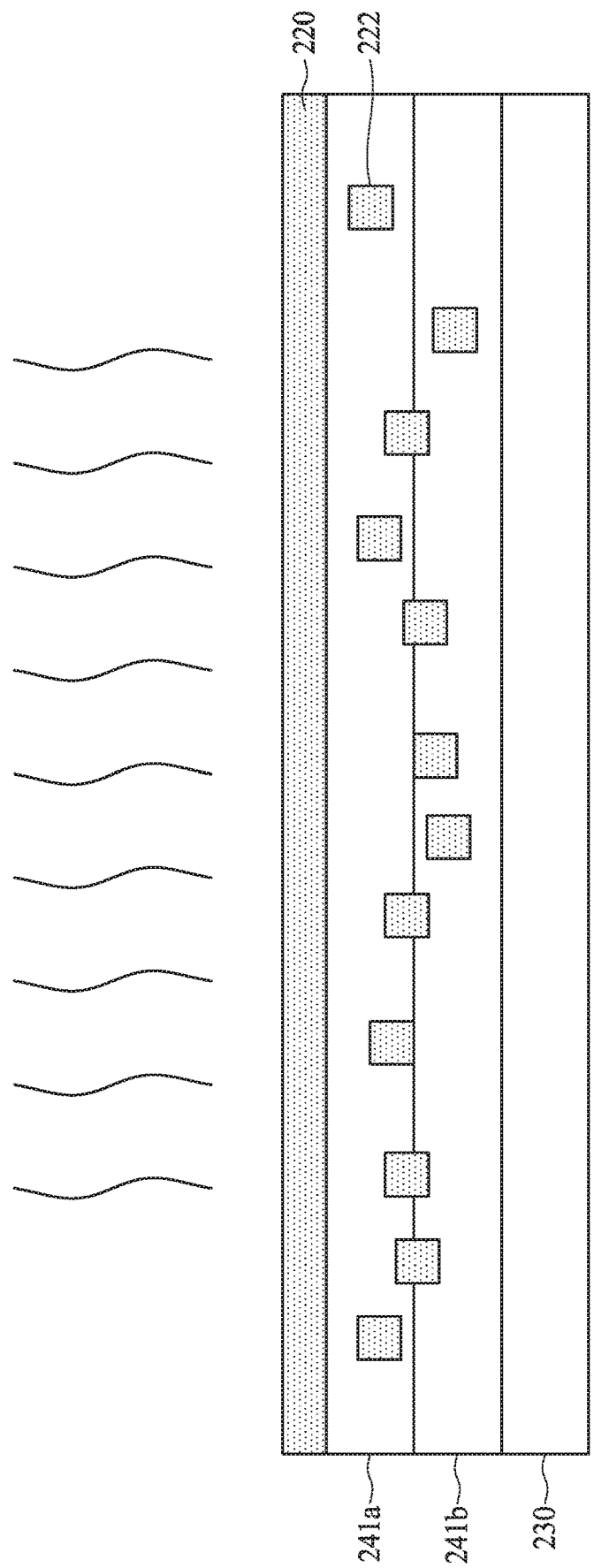

FIG. 13A-13C illustrate some operations of manufacturing a light emitting device. In FIG. 13A, a substrate including a first type carrier injection layer 230 and a composite first type carrier transportation layer is provided.

In FIG. 13B, a metal or metal complex layer 220 is disposed on the composite first type carrier transportation layer. The metal complex layer can be formed by various deposition processes such as, vapor deposition, sputtering, atomic layer deposition (ALD), heat evaporation, coating, or jetting. In some embodiments, the thickness of layer 220 is about 30 Å or less. Layer 220 may include oxygen, nitrogen, argon, fluorine, carbon, etc.

A treatment process is introduced in FIG. 13C. The treatment process can be performed by heating, microwave, plasma treatment. The treatment is applied directly on layer 220. During the treatment, layer 220 is broken down such that transitional metal element 222 in layer 220 can penetrate into the first type carrier transportation layer 241. In some embodiments, the distribution of the transitional metal element 222 may have a gradient. In some embodiments, a density of the transitional metal element 222 at the top surface of the first type carrier transportation layer 241 is higher than a density at a location proximal to the interface between first type carrier transportation layer 241 and the first type carrier injection layer 230. Similarly, the above metal diffusion operation can be applied to the second type carrier transportation layer.

Figure 13D:
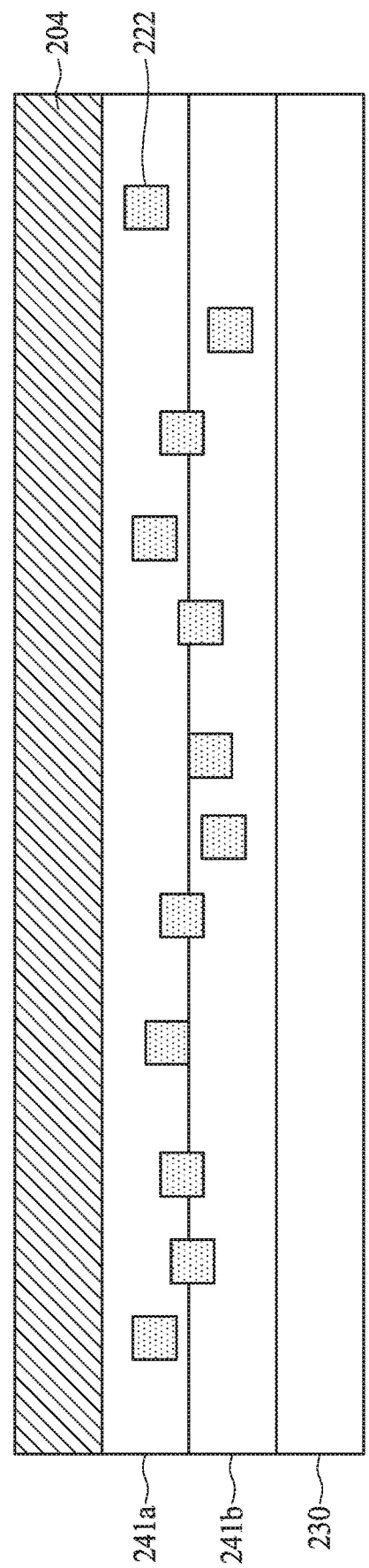

After the treatment, the layer 220 may disappear or be removed from the surface of the first type carrier transportation layer 241. A photo sensitive organic light emitting layer 204 is disposed over the first type carrier transportation layer 241 after the treatment or removal process as in FIG. 13D.

Figure 13E:
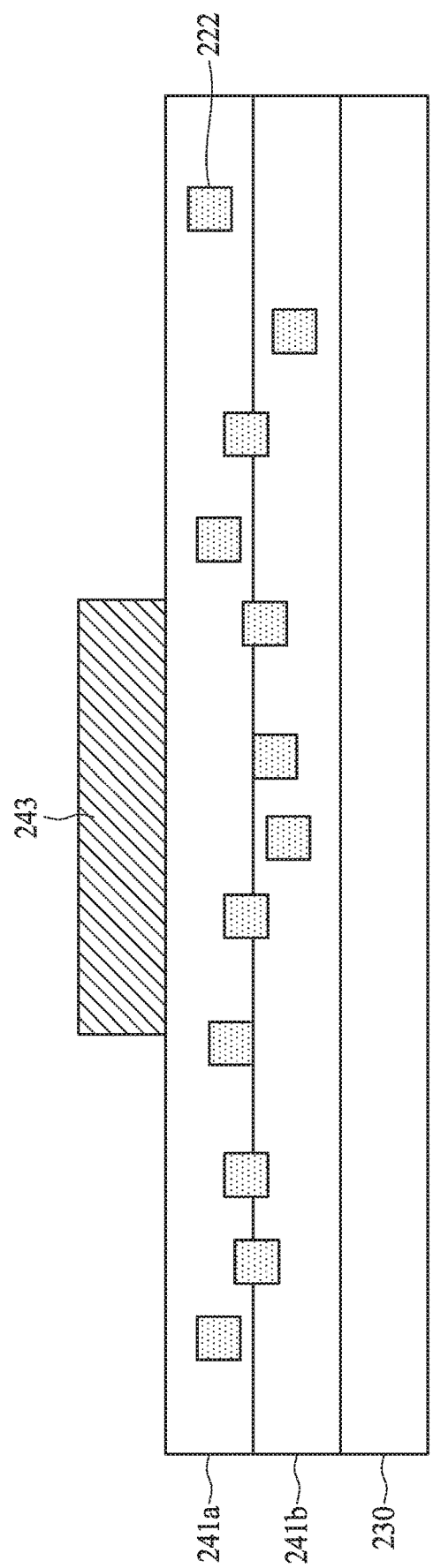

In FIG. 13E, a patterning process, such as photolithography, is introduced to remove excessive portion and form a light emitting unit 243.

Figure 14A:
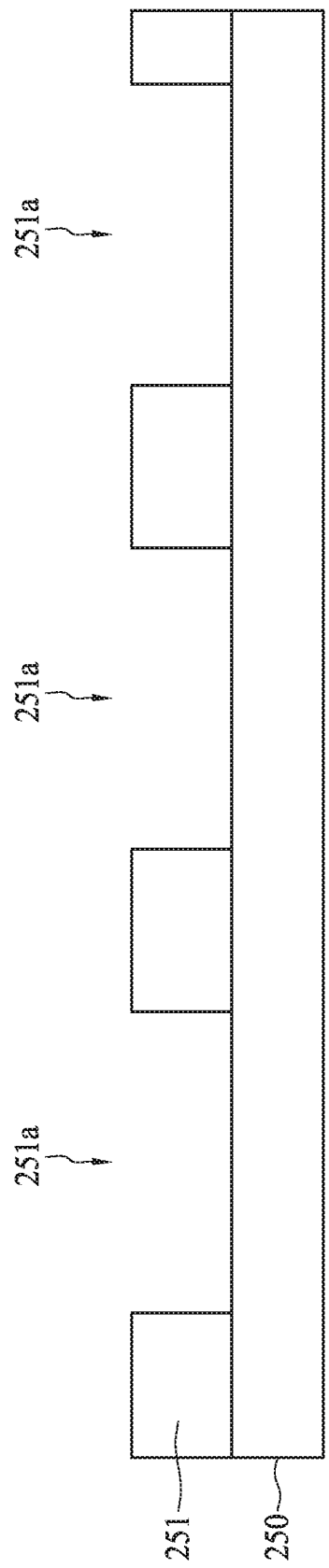

FIG. 14A-FIG. 14D illustrate another embodiment to form light emitting units 243 on a substrate 250. In some embodiments, the substrate 250 includes a carrier transportation layer. In some embodiments, the substrate 250 includes a TFT (thin film transistor) array. In FIG. 14A, a patterned photosensitive layer 251 is formed on the substrate 250. In some embodiments, the patterned photosensitive layer 251 is a photo absorption material as the photo absorption material 145 in FIG. 10. In some embodiments, the patterned photosensitive layer 251 is used as a pattern defined layer. A region 251a is defined by two adjacent patterned photosensitive mesas and the region 251a is configured to receive an organic light emitting unit. In some embodiments, the patterned photosensitive layer 251 is fluorine free, i.e. substantially contains no fluorine.

Figure 14C:
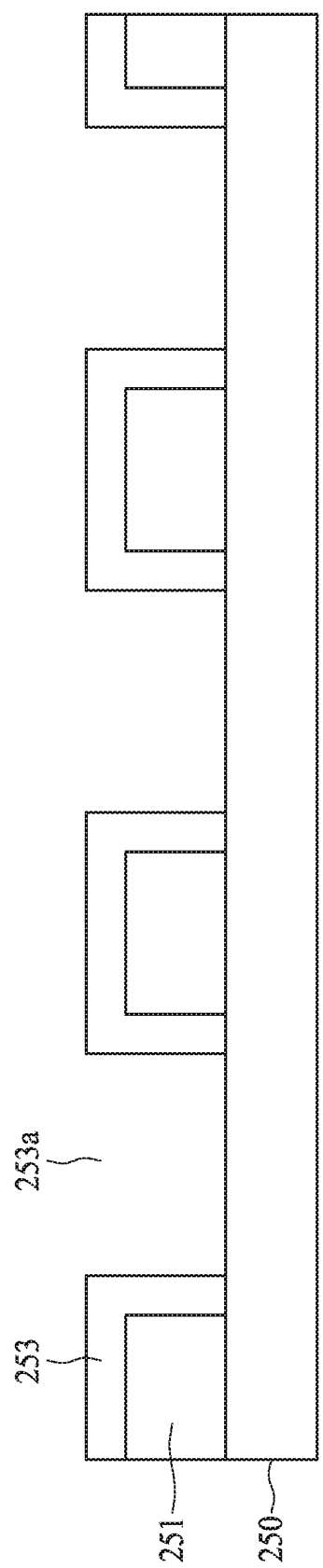
Figure 14D:
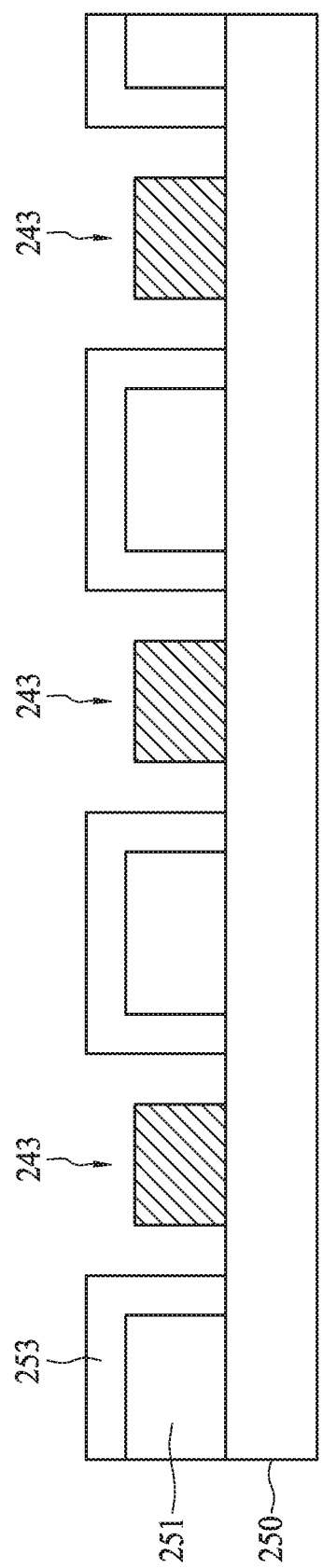

In FIG. 14B, a photo resist layer 253 is disposed over the photosensitive layer 251 and in the region 251a. In some embodiments, the photo resist layer 253 contains fluorine. In FIG. 14C, the photo resist layer 253 is patterned to have openings 253a. In some embodiments, each opening 253a has a width less than about 10 um. In FIG. 14D, an organic light emitting unit 243 is formed in the opening 253a. In some embodiments, the organic light emitting unit 243 has a height that is smaller than a height of the photosensitive layer 251. The photo resist layer 253 can be removed in another step (not shown in the drawings).

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A light emitting device, comprising:
   a substrate;
   an array of organic light emitting units over the substrate;
   a secondary light emitting unit adjacent to one of the organic light emitting units in the array, wherein the secondary light emitting unit includes a second height and the one of the organic light emitting units in the array includes a first height, the second height is smaller than the first height;
   wherein the organic light emitting units in the array has a gap with an aspect ratio, wherein the aspect ratio is correlated to a height ratio between the secondary light emitting unit and an organic light emitting unit adjacent to the secondary light emitting unit.

2. The light emitting device in claim 1, further comprising a first type carrier transportation layer under the array of organic light emitting units and the secondary light emitting unit.

3. The light emitting device in claim 2, wherein the first type carrier transportation layer is a composite structure.

4. The light emitting device in claim 1, wherein the secondary light emitting unit is in a strip shape.

5. The light emitting device in claim 1, wherein the secondary light emitting unit is in a circular shape.

6. The light emitting device in claim 1, wherein the secondary light emitting unit is in a quadrilateral shape.

7. The light emitting device in claim 1, further comprising a second type carrier transportation layer over the array of organic light emitting units.

8. The light emitting device in claim 7, wherein the second type carrier transportation layer is a composite structure.

9. The light emitting device in claim 1, further comprising a carrier transportation layer commonly shared by at least two of the organic light emitting units in the array.

10. The light emitting device in claim 1, further comprising a first carrier transportation layer and a second type carrier transportation layer, wherein at least one of the first type carrier transportation layer and the second type carrier transportation layer includes a metal element.

11. The light emitting device in claim 10, wherein the metal element is a transition metal.

12. The light emitting device in claim 1, wherein at least one of the organic light emitting units in the array has a width being not greater than 2 um.

13. The light emitting device in claim 1, wherein the substrate has a minimum bend radius being not greater than 10 mm.

14. A method of manufacturing a light emitting device, comprising:
    providing a substrate;
    forming a first type carrier transportation layer over the substrate;
    forming a metallic layer on the first type carrier transportation layer;
    treating the surface of the metallic layer thereby driving a metallic element from the metallic layer into the first type carrier transportation layer;
    forming a photo sensitive organic light emitting layer over the first type carrier transportation layer; and
    patterning the photo sensitive organic light emitting layer to form a light emitting unit.

15. The method of manufacturing a light emitting device in claim 14, wherein the metallic layer includes a transition metal.

16. The method of manufacturing a light emitting device in claim 14, wherein treating the surface of the metallic layer includes one of heating, microwave, or plasma treatment.

17. The method of manufacturing a light emitting device in claim 14, further comprising a first type carrier injection layer between the first type carrier transportation layer and the substrate.

18. A light emitting device, comprising: a substrate; and a first light emitting unit and a second light emitting unit over the substrate, wherein the second light emitting unit includes a second height and the one of the first light emitting units includes a first height, wherein a gap is between the first light emitting unit and the second light emitting unit and the gap has an aspect ratio, wherein the aspect ratio is correlated to a height ratio between the first light emitting unit and the second light emitting unit.

19. The light emitting device in claim 18, further comprising a carrier transportation layer in the substrate.

20. The light emitting device in claim 19, wherein the carrier transportation layer includes a metal element.

* * * * *